United States Patent
Lin et al.

(10) Patent No.: US 6,762,115 B2
(45) Date of Patent: *Jul. 13, 2004

(54) CHIP STRUCTURE AND PROCESS FOR FORMING THE SAME

(75) Inventors: Mou-Shiung Lin, Hsinchu (TW); Jin-Yuan Lee, Hsinchu (TW); Ching-Cheng Huang, Hsinchu (TW)

(73) Assignee: Megic Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/125,226

(22) Filed: Apr. 16, 2002

(65) Prior Publication Data

US 2002/0115282 A1 Aug. 22, 2002

Related U.S. Application Data

(63) Continuation-in-part of application No. 09/972,639, filed on Oct. 9, 2001, and a continuation-in-part of application No. 09/691,497, filed on Oct. 18, 2000, now Pat. No. 6,495,442, and a continuation-in-part of application No. 09/251,183, filed on Feb. 17, 1999, now Pat. No. 6,383,916, and a continuation-in-part of application No. 09/216,791, filed on Dec. 21, 1998, now abandoned.

(30) Foreign Application Priority Data

Dec. 13, 2001 (TW) ........................................ 90130876 A
Dec. 14, 2001 (TW) ........................................ 90131030 A
Dec. 21, 2001 (TW) ........................................ 90131796 A

(51) Int. Cl.[7] .............................................. H01L 21/44
(52) U.S. Cl. .................................................... 438/598
(58) Field of Search ................................ 438/598, 599, 438/618, 622, 624–629, 637, 648, 642–645, 650, 656, 652–654, 672, 680, 665–688, 106, 108, 113, 125, 126, 758, 761, 778, 759

(56) References Cited

U.S. PATENT DOCUMENTS

| | | | | |
|---|---|---|---|---|
| 5,534,465 A | * | 7/1996 | Frye et al. | 438/108 |
| 5,612,254 A | * | 3/1997 | Mu et al. | 438/634 |
| 6,303,423 B1 | * | 10/2001 | Lin | 438/238 |
| 6,383,916 B1 | * | 5/2002 | Lin | 438/637 |
| 6,495,442 B1 | * | 12/2002 | Lin et al. | 438/618 |
| 6,596,560 B1 | * | 7/2003 | Hsu | 438/108 |

* cited by examiner

*Primary Examiner*—David A. Zarneke
(74) *Attorney, Agent, or Firm*—J.C. Patents

(57) ABSTRACT

A chip structure comprises a substrate, a first built-up layer, a passivation layer and a second built-up layer. The substrate includes many electric devices placed on a surface of the substrate. The first built-up layer is located on the substrate. The first built-up layer is provided with a first dielectric body and a first interconnection scheme, wherein the first interconnection scheme interlaces inside the first dielectric body and is electrically connected to the electric devices. The first interconnection scheme is constructed from first metal layers and plugs, wherein the neighboring first metal layers are electrically connected through the plugs. The passivation layer is disposed on the first built-up layer and is provided with openings exposing the first interconnection scheme. The second built-up layer is formed on the passivation layer. The second built-up layer is provided with a second dielectric body and a second interconnection scheme, wherein the second interconnection scheme interlaces inside the second dielectric body and is electrically connected to the first interconnection scheme. The second interconnection scheme is constructed from at least one second metal layer and at least one via metal filler, wherein the second metal layer is electrically connected to the via metal filler. The thickness, width, and cross-sectional area of the traces of the second metal layer are respectively larger than those of the first metal layers.

34 Claims, 15 Drawing Sheets

CHIP STRUCTURE AND PROCESS FOR FORMING THE SAME

CROSS-REFERENCE TO RELATED APPLICATION

The present application is a continuation-in-part of a patent application Ser. No. 09/216,791, filed Dec. 21, 1998, by M. S. Lin, now abandoned. The present application is a continuation-in-part of a patent application Ser. No. 09/251,183, filed Feb. 17, 1999, by M. S. Lin, now U.S. Pat. No. 6,383,916. The present application is a continuation-in-part of a patent application Ser. No. 09/691,497, filed Oct. 18, 2000, by M. S. Lin and J. Y. Lee, now U.S. Pat. No. 6,495,442. The present application is a continuation-in-part of a pending patent application Ser. No. 09/972,639, filed Oct. 9, 2001, by M. S. Lin. All disclosures of these prior applications are incorporated herein by reference.

BACKGROUND OF THE INVENTION

1. Field of the Invention

The invention relates in general to a chip structure and a process for forming the same. More particularly, the invention relates to a chip structure for improving the resistance-capacitance delay and a forming process thereof.

2. Description of the Related Art

Nowadays, electronic equipment are increasingly used to achieve many various tasks. With the development of electronics technology, miniaturization, multifunction task, and comfort of utilization are among the principle guidelines of electronic product manufacturers. More particularly in semiconductor manufacture process, the semiconductor units with 0.18 microns have been mass-produced. However, the relatively fine interconnections therein negatively impact the chip. For example, this causes the voltage drop of the buses, the resistance-capacitor delay of the key traces, and noises, etc.

FIG. 1 is a cross-sectional view showing a conventional chip structure with interconnections.

As shown in FIG. 1, a chip structure 100 is provided with a substrate 110, an built-up layer 120 and a passivation layer 130. There are plenty of electric devices 114, such as transistors, on a surface 112 of the substrate 110, wherein the substrate 110 is made of, for example, silicon. The built-up layer 120 provided with a dielectric body 122 and an interconnection scheme 124 is formed on the surface 112 of the substrate 110. The interconnection scheme 124 interlaces inside the dielectric body 122 and is electrically connected to the electric devices 114. Further, the interconnection scheme 124 includes many conductive pads 126 exposed outside the dielectric body 122 and the interconnection scheme 124 can electrically connect with external circuits through the conductive pads 126. The dielectric body 122 is made of, for instance, silicon nitride or silicon oxide. In addition, the passivation layer 130 is deposited on the built-up layer 120, and has many openings respectively exposing the conductive pads 126. The interconnection scheme 124 includes at least one metal layer that can serve as a power bus or a ground bus. The power bus or the ground bus is connected to at least one of the conductive pads 126 through which the power bus or the ground bus can electrically connect with external circuits.

However, as far as the chip structure 100 is concerned, resistance-capacitance (RC) delay is easily generated because the line width of the interconnection scheme 124 is extremely fine, about below 0.3 microns, the thickness of the interconnection scheme 124 is extremely thin, and the dielectric constant of the dielectric body 122 is extremely high, about 4. Therefore, the chip efficiency drops off. In particular, the RC delay even usually occurs with respect to a power bus, a ground bus or other metal lines transmitting common signals. In addition, the production of the interconnection scheme 124 with extremely fine line width is necessarily performed using facilities with high accuracy. This causes production costs to dramatically rise.

The present invention is related to a R.O.C. patent application Ser. No. 88120548, filed Nov. 25, 1999, by M. S. Lin, issued Sep. 1, 2001, now R.O.C. Pat. No.140721. R.O.C. patent application Ser. No. 88120548 claims the priority of pending U.S. patent application Ser. No. 09/251,183 and the subject matter thereof is disclosed in pending U.S. patent application Ser. No. 09/251,183. The present invention is related to a R.O.C. patent application Ser. No.90100176, filed Jan. 4, 2001, by M. S. Lin and J. Y. Lee, now pending. The subject matter of R.O.C. patent application Ser. No.90100176 is disclosed in pending U.S. patent application Ser. No. 09/691,497. The present invention is related to a Japanese patent application Ser. No.200156759, filed Mar. 1, 2001, by M. S. Lin and J. Y. Lee, now pending. The present invention is related to a European patent application Ser. No.01480077.5, filed Aug. 27, 2001, by M. S. Lin and J. Y. Lee, now pending. The present invention is related to a Singaporean patent application Ser. No.200101847-2, filed Mar. 23, 2001, by M. S. Lin and J. Y. Lee, now pending. Japanese patent application Ser. No.200156759, European patent application Ser. No.01480077.5, and Singaporean patent application Ser. No.200101847-2 claim the priority of pending U.S. patent application Ser. No. 09/691,497 and the subject matter of them is disclosed in pending U.S. patent application Ser. No. 09/691,497.

SUMMARY OF THE INVENTION

Accordingly, an objective of the present invention is to provide a chip structure and a process for forming the same that improves resistance-capacitance delay and reduces energy loss of the chip.

Another objective of the present invention is to provide a chip structure and a process for forming the same that can be produced using facilities with low accuracy. Therefore, production costs can substantially reduce.

To achieve the foregoing and other objectives, the present invention provides a chip structure that comprises a substrate, a first built-up layer, a passivation layer and a second built-up layer. The substrate includes many electric devices placed on a surface of the substrate. The first built-up layer is located on the substrate. The first built-up layer is provided with a first dielectric body and a first interconnection scheme, wherein the first interconnection scheme interlaces inside the first dielectric body and is electrically connected to the electric devices. The first interconnection scheme is constructed from first metal layers and plugs, wherein the neighboring first metal layers are electrically connected through the plugs. The passivation layer is disposed on the first built-up layer and is provided with openings exposing the first interconnection scheme. The second built-up layer is formed on the passivation layer. The second built-up layer is provided with a second dielectric body and a second interconnection scheme, wherein the second interconnection scheme interlaces inside the second dielectric body and is electrically connected to the first interconnection scheme. The second interconnection scheme is constructed from at least one second metal layer and at least one via metal filler, wherein the second metal layer is electrically connected to the via metal filler. The thickness, width, and cross-sectional area of the traces of the second metal layer are respectively larger than those of the first metal layers. In addition, the first dielectric body is constructed from at least one first dielectric layer, and the second dielectric body is constructed from at least one second dielectric layer. The individual second dielectric layer is thicker than the individual first dielectric layer.

According to a preferred embodiment of the present invention, the thickness of the traces of the second metal layer ranges from 1 micron to 50 microns; the width of the traces of the second metal layer ranges from 1 micron to 1 centimeter; the cross sectional area of the traces of the second metal layer ranges from 1 square micron to 0.5 square millimeters. The first dielectric body is made of, for example, an inorganic compound, such as a silicon nitride compound or a silicon oxide compound. The second dielectric body is made of, for example, an organic compound, such as polyimide (PI), benzocyclobutene (BCB), porous dielectric material, or elastomer. In addition, the above chip structure further includes at least one electrostatic discharge (ESD) circuit and at least one transitional unit that are electrically connected to the first interconnection scheme. The transitional unit can be a driver, a receiver or an I/O circuit. Moreover, the first interconnection scheme include at least one first conductive pad, at least one second conductive pad, and at least one linking trace, wherein the openings of the passivation layer expose the first conductive pad and the second conductive pad. The second conductive pad is electrically connected to the second interconnection scheme. The first conductive pad is exposed to the outside. The linking trace connects the first conductive pad with the second conductive pad and is shorter than 5,000 microns.

To sum up, the chip structure of the present invention can decline the resistance-capacitance delay, the power of the chip, and the temperature generated by the driving chip since the cross sectional area, the width and the thickness of the traces of the second metal layer are extremely large, since the cross sectional area of the via metal filler is also extremely large, since the second interconnection scheme can be made of low-resistance material, such as copper or gold, since the thickness of the individual second dielectric layer is also extremely large, and since the second dielectric body can be made of organic material, the dielectric constant of which is very low, approximately between 1~3, the practical value depending on the applied organic material.

In addition, the chip structure of the present invention can simplify a design of a substrate board due to the node layout redistribution, fitting the design of the substrate board, of the chip structure by the second interconnection scheme and, besides, the application of the fewer nodes to which ground voltage or power voltage is applied. Moreover, in case the node layout redistribution of various chips by the second interconnection scheme causes the above various chips to be provided with the same node layout, the node layout, matching the same node layout of the above various chips, of the substrate board can be standardized. Therefore, the cost of fabricating the substrate board substantially drops off.

Moreover, according to the chip structure of the present invention, the second interconnection scheme can be produced using facilities with low accuracy. Therefore, production costs of the chip structure can substantially be reduced.

To achieve the foregoing and other objectives, the present invention provides a process for making the above chip structure. The process for fabricating a chip structure comprises the following steps.

Step 1: A wafer is provided with a passivation layer, and the passivation layer is disposed on a surface layer of the wafer.

Step 2: A dielectric sub-layer is formed over the passivation layer of the wafer, and the dielectric sub-layer has at least one opening passing through the dielectric sub-layer.

Step 3: At least one conductive metal is formed onto the dielectric sub-layer and into the opening; and Step 4: the conductive metal formed outside the opening is removed.

Provided that multiple metal layers are to be formed, the sequential steps 2–4 are repeated at least one time.

To achieve the foregoing and other objectives, the present invention provides another process for making the above chip structure. The process for fabricating a chip structure comprises the following steps.

Step 1: A wafer is provided with a passivation layer, and the passivation layer is disposed on a surface layer of the wafer.

Step 2: A first dielectric sub-layer is formed over the passivation layer of the wafer, and the first dielectric sub-layer has at least one via metal opening passing through the first dielectric sub-layer.

Step 3: A first conductive layer is formed onto the first dielectric sub-layer and into the via metal opening.

Step 4: At least one first conductive metal is formed onto the first conductive layer.

Step 5: The first conductive layer and the first conductive metal that are formed outside the via metal opening are removed.

Step 6: A second dielectric sub-layer is formed onto the first dielectric sub-layer. The second dielectric sub-layer has at least one metal-layer opening passing through the second dielectric sub-layer. The metal-layer opening exposes the first conductive metal formed in the via metal opening.

Step 7: A second conductive layer is formed onto the second dielectric sub-layer and into the metal-layer opening.

Step 8: At least one second conductive metal is formed onto the second conductive layer.

Step 9: The second conductive layer and the second conductive metal that are formed outside the metal-layer opening are removed.

Provided that multiple metal layers are to be formed, the sequential steps 2–9 are repeated at least one time.

To achieve the foregoing and other objectives, the present invention provides another process for making the above chip structure. The process for fabricating a chip structure comprises the following steps.

Step 1: A wafer is provided with a passivation layer and the passivation layer is disposed on a surface layer of the wafer.

Step 2: A first dielectric sub-layer is formed over the passivation layer of the wafer. The first dielectric sub-layer has at least one via metal opening passing through the first dielectric sub-layer.

Step 3: A second dielectric sub-layer is formed onto the first dielectric sub-layer and into the via metal opening;

Step 4: The second dielectric sub-layer deposited in the via metal opening and at least one part of the second dielectric sub-layer deposited on the first dielectric sub-layer are removed. The removed part of the second dielectric sub-layer outside the via metal opening is defined as at least one metal-layer opening. The metal-layer opening connects with the via metal opening.

Step 5: A conductive layer is formed onto the second dielectric sub-layer, into the via metal opening and into the metal-layer opening.

Step 6: At least one conductive metal is formed onto the conductive layer.

Step 7: The conductive layer and the conductive metal that are formed outside the metal-layer opening are removed.

Provided that multiple metal layers are to be formed, the sequential steps 2–7 are repeated at least one time.

To achieve the foregoing and other objectives, the present invention provides a process for making a patterned dielectric sub-layer. A process for forming a patterned dielectric sub-layer comprises the following steps.

Step 1: A dielectric sub-layer that is photosensitive is provided.

Step 2: A photolithography process is performed. In the meanwhile, a photo mask is provided with a first region and a second region. The energy of the light passing through the first region is stronger than that of the light passing through the second region. An exposing process and a developing process are used to form at least one via metal opening passing through the dielectric sub-layer and at least one metal-layer opening not passing through the dielectric sub-layer. The via metal opening connects with the metal-layer opening. Further, during the exposing process, the first region is aligned with where the via metal opening is to be formed while the second region is aligned with where the metal-layer opening is to be formed. The first region of the photo mask is like a through-hole type. The first region of the photo mask is like a type of a semi-transparent membrane.

To achieve the foregoing and other objectives, the present invention provides another process for making a patterned dielectric sub-layer. A process for forming a patterned dielectric sub-layer comprises the following steps.

Step 1: A first dielectric sub-layer is provided with at least one first opening passing therethrough.

Step 2: A second dielectric sub-layer is formed onto the first dielectric sub-layer and into the first opening.

Step 3: The second dielectric sub-layer deposited in the via metal opening and at least one part of the second dielectric sub-layer deposited on the first dielectric sub-layer are removed. The removed part of the second dielectric sub-layer outside the via metal opening is defined as at least one metal-layer opening. The metal-layer opening connects with the via metal opening.

Provided the first dielectric sub-layer is non-photosensitive material and the second dielectric sub-layer is photosensitive material, a photolithography process is used, during Step 3, to remove the second dielectric sub-layer. In addition, provided a photolithography process and an etching process are used, during Step 3, to remove the second dielectric sub-layer, the etchant of the second dielectric sub-layer hardly etches the first dielectric sub-layer.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. A simple description of the drawings is as follows.

DESCRIPTION OF THE PREFERRED EMBODIMENTS

Prior to describing the embodiment of the invention, the factors of the resistance-capacitance delay and those of the power loss will be introduced as the following equations.

$$\tau = RC = 2\epsilon\rho L[L/(T_{u.d.}T_m) + L/(WS)]$$

$$P \propto 2\pi f V^2 k\epsilon (\tan \delta)$$

where $\tau$ is effect of resistance-capacitance delay; P is power loss; $\epsilon$ is dielectric constant of dielectric material; $\rho$ is resistance of traces; L is trace length; W is trace width; S is pitch between traces; $T_{u.d.}$ is thickness of dielectric material; $T_m$ is trace thickness; $\tan \delta$ is dielectric loss; V is applied voltage; f is frequency; k is factor of capacitor structure.

According to the above equation, the factors of the resistance-capacitance delay and those of the power loss can be known. Therefore, an increase in thickness of every dielectric layer, an application of dielectric material with low dielectric constant, an application of traces with low resistance, or an increase in width or thickness of traces leads an effect of a resistance-capacitance delay and a power loss of a chip to decline.

Figure 1:
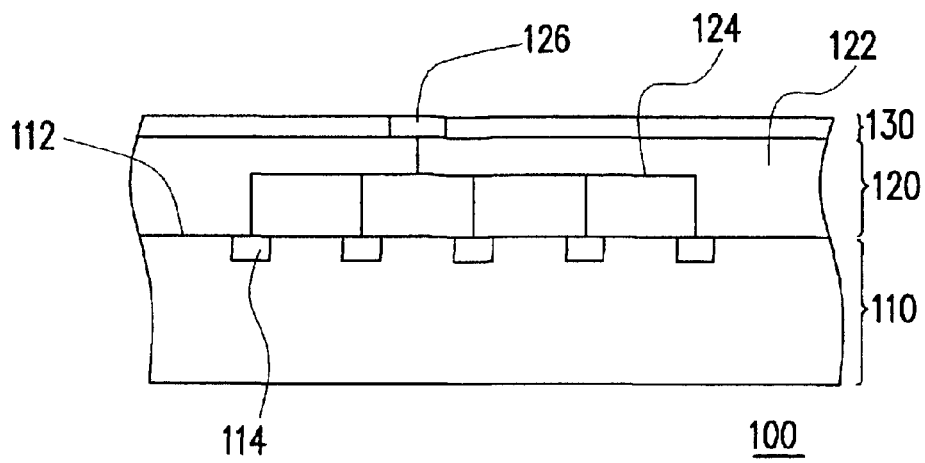
FIG. 1 is a cross-sectional view schematically showing a conventional chip structure with interconnections.
Figure 2:
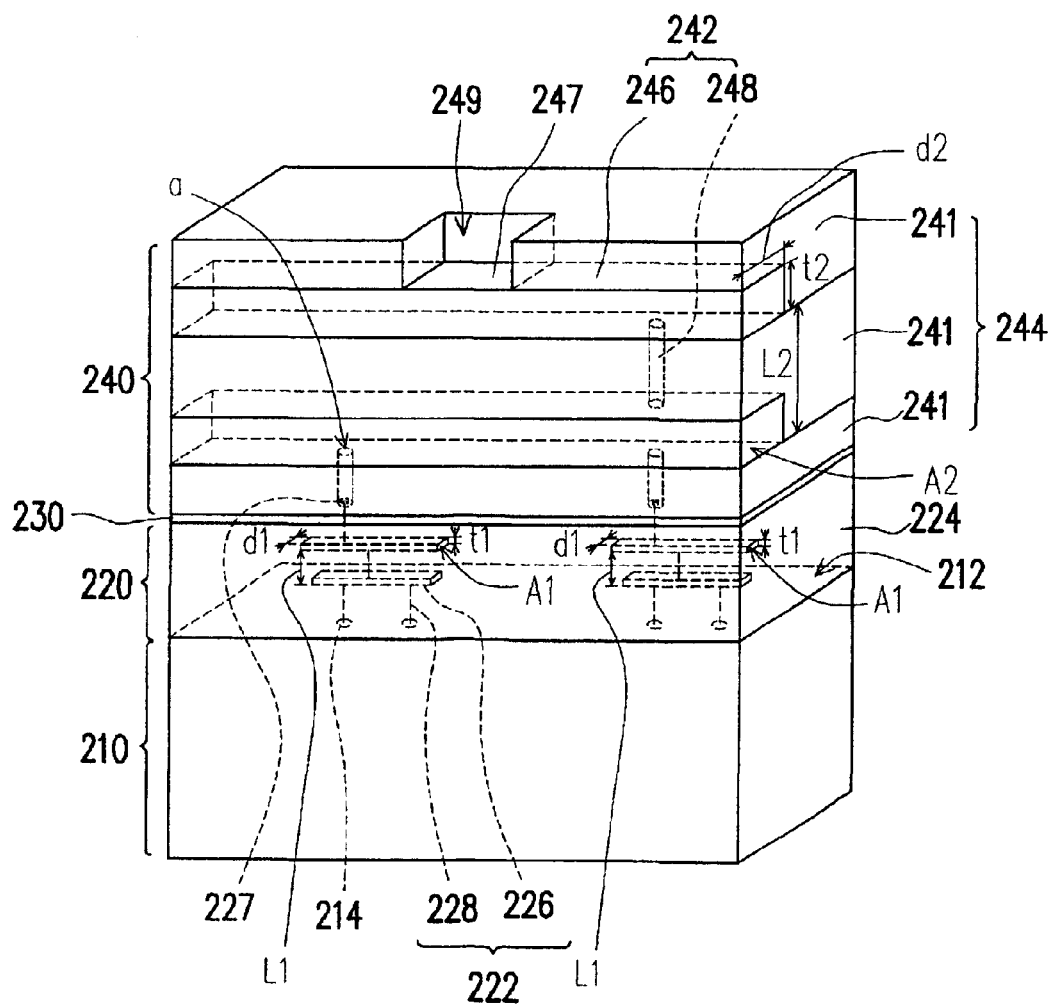
FIG. 2 is a cross-sectional view schematically showing a chip structure according to a first embodiment of the present invention.

According to the above conception, the present invention provides various improved chip structure. Please refer to FIG. 2, a cross-sectional view schematically showing a chip structure according to a first embodiment of the present invention. A chip structure 200 is provided with a substrate 210, a first built-up layer 220, a passivation layer 230 and a second built-up layer 240. There are plenty of electric devices 214, such as transistors, on a surface 212 of the substrate 210, wherein the substrate 210 is made of, for example, silicon. The first built-up layer 220 is located on the substrate 210. The first built-up layer 220 is formed by cross lamination of first metal multi-layers 226 and first dielectric multi-layers. Moreover, plugs 228 connect the upper first metal layers 226 with the lower first metal layers 226 or connect the first metal layers 226 with the electric devices 214. The first metal multi-layers 226 and the plugs 228 compose a first interconnection scheme 222. The first dielectric multi-layers compose a first dielectric body 224. The first interconnection scheme 222 interlaces inside the first dielectric body 224 and is electrically connected to the electric devices 214. The first interconnection scheme 222 includes plenty of conductive pads 227 (only shows one of them) that are exposed outside the first dielectric body 224. The first interconnection scheme 222 can electrically connect with other circuits through the conductive pads 227. The first dielectric body 224 is made of, for example, an inorganic compound, such as a silicon oxide compound or a silicon nitride compound. The material of the first interconnection scheme 222 includes, for example, copper, aluminum or tungsten. Provided that the first interconnection scheme 222 is formed by a copper process, the first metal layers 226 and the plugs 228 are made of copper. Provided that the first interconnection scheme 222 is formed by a general process, the first metal layers 226 are made of aluminum and the plugs 228 are made of tungsten.

The passivation layer 230 is disposed on the first built-up layer 220 and is provided with openings exposing the conductive pads 227. The passivation layer 230 is contructed of, for example, an inorganic compound, such as a silicon oxide compound, a silicon nitride compound, phosphosilicate glass (PSG), a silicon oxide nitride compound or a composite formed by laminating the above material.

The second built-up layer 240 is formed on the passivation layer 230. The second built-up layer 240 is formed by cross lamination of second metal multi-layers 246 and second dielectric multi-layers 241. Moreover, via metal fillers 248 connect the upper second metal layers 246 with the lower second metal layers 246 or connect the second metal layers 246 with the conductive pads 227. The second metal layers 246 and the via metal fillers 248 compose a second interconnection scheme 242. The second dielectric multi-layers 241 compose a second dielectric body 244. The second interconnection scheme 242 interlaces inside the second dielectric body 244 and is electrically connected to the conductive pads 227. The second interconnection scheme 242 includes plenty of nodes 247 (only shows one of them). The second dielectric body 244 is provided with openings 249 exposing the nodes 247 of the second interconnection scheme 242. The second interconnection scheme 242 can electrically connect with external circuits through the nodes 247. The second dielectric body 244 is made of, for example, an organic compound, such as polyimide (PI), benzocyclobutene (BCB), porous dielectric material, parylene, elastomer, or other macromolecule polymers. The material of the second interconnection scheme 242 includes, for example, copper, aluminum, gold, nickel, titanium-tungsten, titanium or chromium. Because mobile ions and moisture of the second built-up layer 240 can be prevented by the passivation layer 230 from penetrating into the first built-up layer 220 or the electric devices 214, it is practicable that an organic compound and various metals are formed over the passivationtion layer 230. The cross-sectional area A2 of the traces of the second metal layers 246 is extremely larger than the cross-sectional area A1 of the traces of the first metal layers 226 and than the cross-sectional area of the plugs 228. The cross-sectional area a of the via metal fillers 248 is extremely larger than the cross-sectional area A1 of the traces of the first metal layers 226 and than the cross-sectional area of the plugs 228. The trace width d2 of the second metal layers 246 is extremely larger than the trace width d1 of the first metal layers 226. The trace thickness t2 of the second metal layers 246 is extremely larger than the trace thickness t1 of the first metal layers 226. The thickness L2 of the individual second dielectric layers 241 is extremely larger than the thickness L1 of the individual first dielectric layers of the first built-up layers 220. The cross-sectional area a of the via metal fillers 248 is extremely larger than the area, exposed outside the passivation layer 230, of the conductive pads 227. The trace width d2 of the second metal layers 246 is larger than 1 micron, and preferably ranges from 1 micron to 1 centimeter. The trace thickness t2 of the second metal layers 246 is larger than 1 micron, and preferably ranges from 1 micron to 50 microns. The cross-sectional area A2 of the second metal layers 246 is larger than 1 square micron, and preferably ranges from 1 square micron to 0.5 square millimeters. The cross-sectional area a of the via metal fillers 248 is larger than 1 square micron, and preferably ranges from 1 square micron to 10,000 square microns. The thickness L2 of the individual second dielectric layers 241 is larger than 1 micron, and preferably ranges from 1 micron to 100 microns.

The above chip structure can decline the resistance-capacitance delay, the power of the chip, and the temperature generated by the driving chip since the cross sectional area, the width and the thickness of the traces of the second metal layers 246 are extremely large, since the cross sectional area of the via metal fillers 248 is also extremely large, since the second interconnection scheme 242 can be made of low-resistance material, such as copper or gold, since the thickness L2 of the individual second dielectric layers 241 is also extremely large, and since the second dielectric body 244 can be made of organic material, the dielectric constant of which is very low, approximately between 1~3, the practical value depending on the applied organic material.

According to the above chip structure, the traces of the second interconnection scheme 242 are extremely wide and thick and the cross-sectional area of the via metal fillers 248 is extremely large. Thus, the second interconnection scheme 242 can be formed by low-cost fabricating processes, such as an electroplating process, an electroless plating process, or a sputtering process, and, moreover, the second interconnection scheme 242 can be produced using facilities with low accuracy. Therefore, the production costs of the chip structure can be substantially saved. In addition, the request for the clean room where the second built-up layer is formed is not high, ranging from Class 10 to Class 100. Consequently, the construction cost of the clean room can be conserved.

The chip structure can simplify a design of a substrate board due to the layout redistribution, fitting the design of the substrate board, of the nodes 247 of the chip structure by the second interconnection scheme 242 and, besides, the application of the fewer nodes 247 to which ground voltage or power voltage is applied. Moreover, in case the layout redistribution of nodes 247 of various chips by the second interconnection scheme 242 causes the above various chips to be provided with the same node layout, the node layout, matching the same node layout of the above various chips, of the substrate board can be standardized. Therefore, the cost of fabricating the substrate board substantially drops off.

Figure 3:
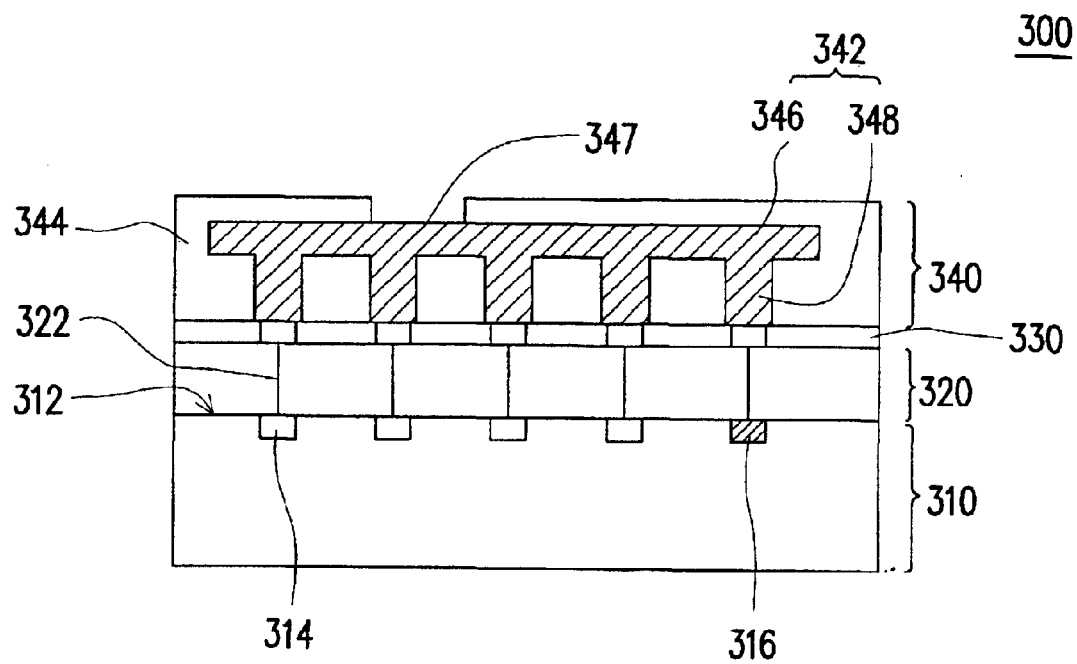
FIG. 3 is a cross-sectional view schematically showing a chip structure according to a second embodiment of the present invention.

Next, other preferred embodiments of the present invention will be introduced. As a lot of electric devices are electrically connected with a power bus and a ground bus, the current through the power bus and the ground bus is relatively large. Therefore, the second interconnection scheme of the second built-up layer can be designed as a power bus or a ground bus, as shown in FIG. 3. FIG. 3 is a cross-sectional view schematically showing a chip structure according to a second embodiment of the present invention. The first interconnection scheme 322 of the built-up layer 320 electrically connects the second interconnection scheme 342 of the built-up layer 340 with the electric devices 314 and at least one electrostatic discharge circuit 316, wherein the electrostatic discharge circuit 316 is disposed on the surface 312 of the substrate 310. As a result, provided that the second interconnection scheme 342 is designed as a power bus, the second interconnection scheme 342 electrically connects with the power ends of the electric devices 314. Provided that the second interconnection scheme 342 is designed as a ground bus, the second interconnection scheme 342 electrically connects with the ground ends of the electric devices 314. The second metal layer 346 of the power bus or that of the ground bus can be of, for example, a planer type. According to the above chip structure, each of the power buses or the ground buses can electrically connect with more electric devices 314 than that of prior art. Consequently, the number of the power buses or the ground buses can be reduced and, also, the number of the electrostatic discharge circuits 316 accompanying the power buses or the ground buses can be reduced. In addition, the number of the nodes 347 accompanying the power buses or the ground buses can be reduced. Thus, the circuit layout can be simplified and the production cost of the chip structure 300 can be saved. The electrostatic discharge circuits 316 can prevent the electric devices 314 electrically connected with the second interconnection scheme 344 from being damaged by the sudden discharge of high voltage. In addition, the chip structure 300 can be electrically connected with external circuits through the nodes 347 applying a flip-chip type, a wire-bonding type or a tape-automated-bonding type.

Figure 4:
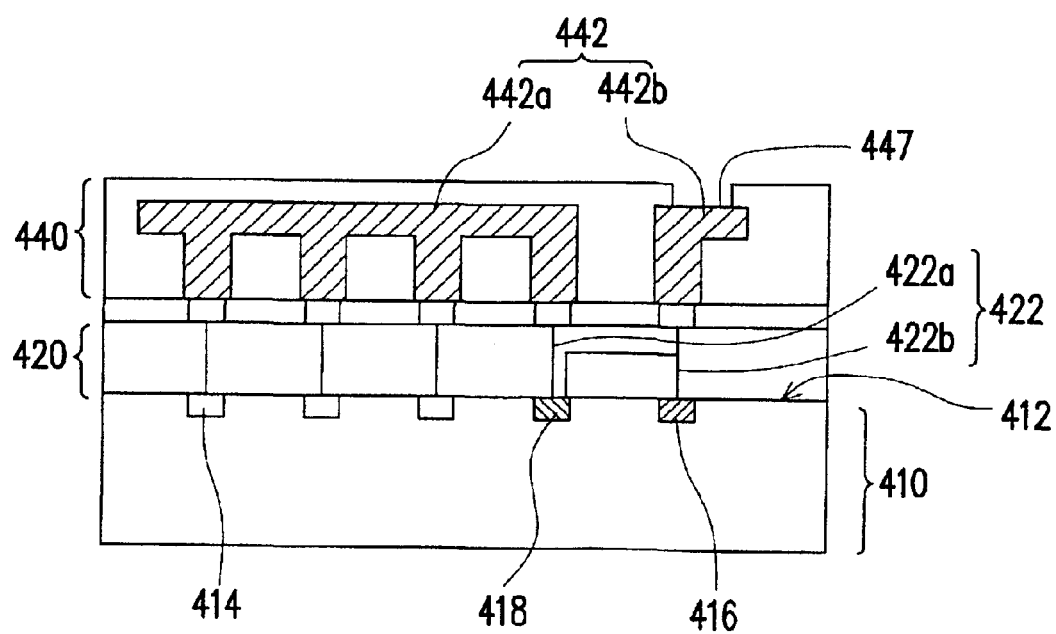
FIG. 4 is a cross-sectional view schematically showing a chip structure according to a third embodiment of the present invention.

Referring to FIG. 4, FIG. 4 is a cross-sectional view schematically showing a chip structure according to a third embodiment of the present invention. There are many electric devices 414, many electrostatic discharge circuits 416 (only shows one of them) and many transition devices 418 (only shows one of them) on the surface 412 of the substrate 410. The first interconnection scheme 422 is divided into first interconnections 422a and first transition interconnections 422b. The second interconnection scheme 442 is divided into second interconnections 442a and second transition interconnections 442b. Consequently, the nodes 447 are electrically connected with the transition devices 418 and the electrostatic discharge circuits 416 through the first transition interconnections 422b and the second transition interconnections 442b. The transition devices 418 are electrically connected with the electric devices 414 through the first interconnections 422a and the second interconnections 442a. For example, this circuit layout can be to transmit clock signals. The electrostatic discharge circuits 416 can prevent the electric devices 414 and the transition devices 418 from being damaged by the sudden discharge of high voltage. In addition, the chip structure can be electrically connected with external circuits through the nodes 447 applying a flip-chip type, a wire-bonding type or a tape-automated-bonding type.

Figure 5:
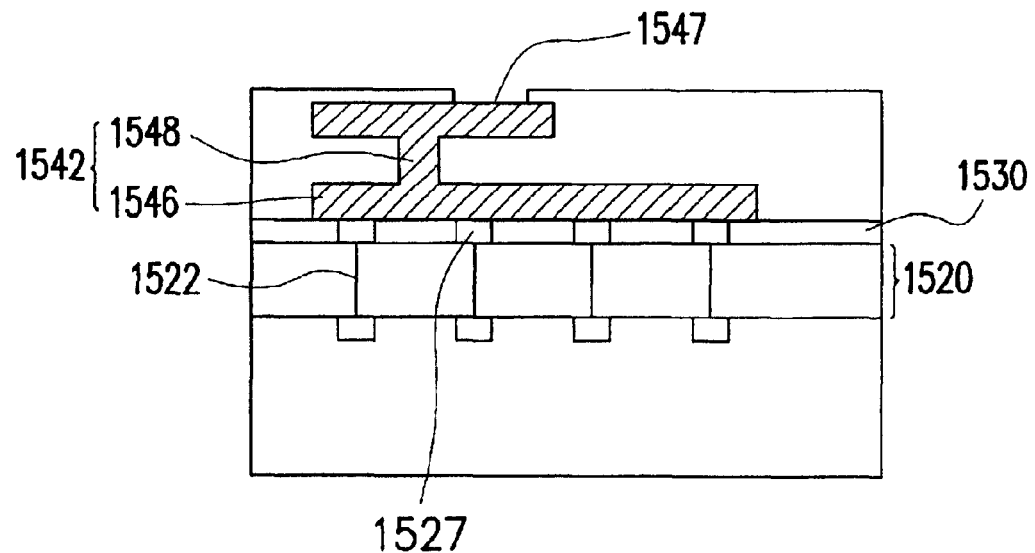
FIG. 5 is a cross-sectional view schematically showing a chip structure according to a forth embodiment of the present invention.

Referring to FIG. 5, FIG. 5 is a cross-sectional view schematically showing a chip structure according to a forth embodiment of the present invention. The second metal layer 1546 of the second interconnection scheme 1542 is directly formed on the passivation layer 1530. Thus, the second metal layer 1546 of the second interconnection scheme 1542 can be directly electrically connected with the conductive pads 1527, exposed outside the passivation layer 1530, of the first interconnection scheme 1522. In addition, the chip structure can be electrically connected with external circuits through the nodes 1547 applying a flip-chip type, a wire-bonding type or a tape-automated-bonding type.

Figure 6:
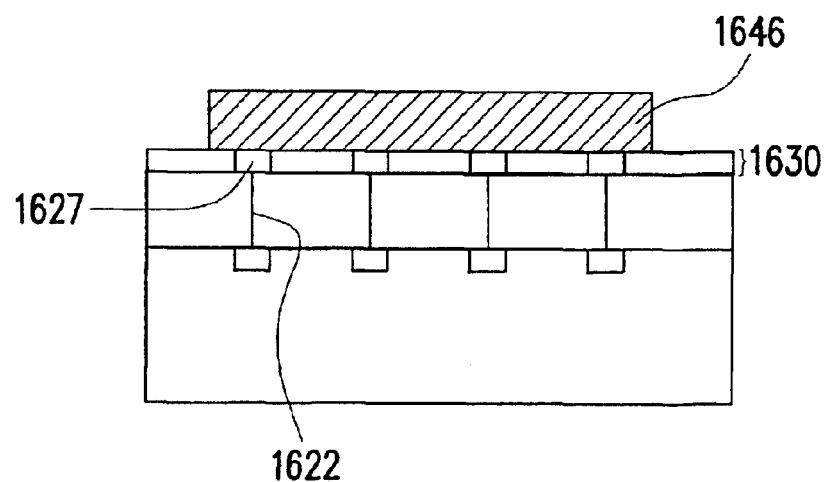
FIG. 6 is a cross-sectional view schematically showing a chip structure according to a fifth embodiment of the present invention.

According to the above embodiment, a second built-up layer is constructed from a second dielectric body and a second interconnection scheme. However, a second built-up layer also can be composed of only a second interconnection scheme, as shown in FIG. 6. FIG. 6 is a cross-sectional view schematically showing a chip structure according to a fifth embodiment of the present invention. The second metal layer 1646 of the second interconnection scheme is directly formed on the passivation layer 1630 and can be directly electrically connected with the conductive pads 1627, exposed outside the passivation layer 1630, of the first interconnection scheme 1622. The second metal layer 1646 is exposed to the outside. In addition, the chip structure can be electrically connected with external circuits by bonding wires onto the second metal layer 1646.

Figure 7:
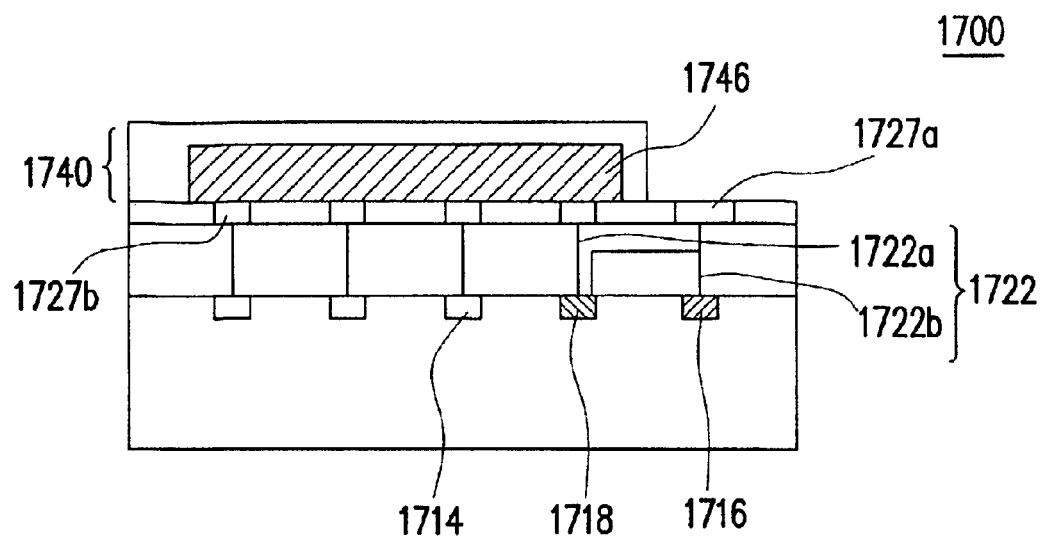
FIG. 7 is a cross-sectional view schematically showing a chip structure according to a sixth embodiment of the present invention.
Figure 8:
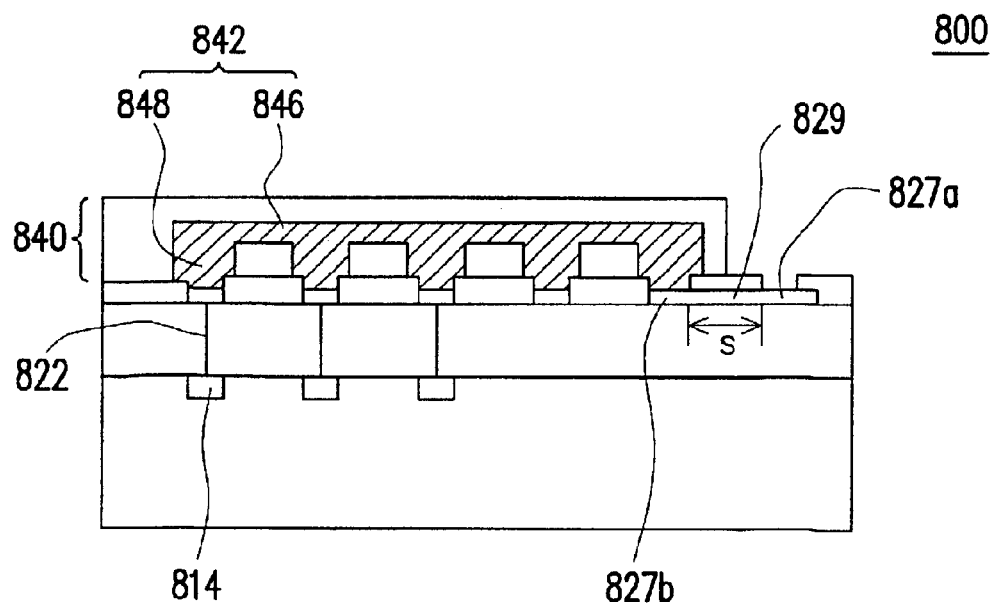
FIG. 8 is a cross-sectional view schematically showing a chip structure according to a seventh embodiment of the present invention.

According to the above chip structure, bumps or wires are directly electrically connected with the second interconnection layer. However, the application of the present invention is not limited to the above embodiment. Bumps or wires also can be directly connected with conductive pads and, besides, through the first interconnection scheme, the bumps or the wires can be electrically connected with the second interconnection scheme, as shown in FIG. 7 and FIG. 8. FIG. 7 is a cross-sectional view schematically showing a chip structure according to a sixth embodiment of the present invention. FIG. 8 is a cross-sectional view schematically showing a chip structure according to a seventh embodiment of the present invention.

Referring to FIG. 7, in the chip structure 1700, the conductive pads 1727a are exposed to the outside and the conductive pads 1727b are directly electrically connected with the second metal layer 1746. The chip structure 1700 can be electrically connected with external circuits by bonding wires (not shown) onto the conductive pads 1727a. Though the first transition interconnections 1722b, the conductive pads 1727a are electrically connected with the electrostatic discharge circuits 1716 and the transition devices 1718 respectively. Though the first interconnections 1722a, the conductive pads 1727b and the second metal layer 1746, the transition devices 1718 are electrically connected with the electric devices 1714. In addition, bumps also can be formed on the conductive pads 1727*a*, and the chip structure 1700 can be electrically connected with external circuits through the bumps.

Referring to FIG. 8, in the chip structure 800, the conductive pads 827*a* are exposed to the outside and the conductive pads 827*b* are directly electrically connected with the second interconnection scheme 842. Linking traces 829 connect the conductive pads 827*a* with the conductive pads 827*b*. The chip structure 800 can be electrically connected with external circuits by bonding wires (not shown) onto the conductive pads 827*a*. Though the linking traces 829 and conductive pads 827*b*, the conductive pads 827*a* are electrically connected with the second interconnection scheme 842. Though the first interconnection scheme 822, the second interconnection scheme 842 is electrically connected with the electric devices 814. In addition, bumps (not shown) also can be formed on the conductive pads 827*a*, and the chip structure 800 can be electrically connected with external circuits through the bumps. The shorter the length S of the linking traces 829, the better the electrical efficiency of the chip structure 800. Otherwise, it is possible that the resistance-capacitance delay and the voltage drop will occur and the chip efficiency will be reduced. It is preferred that the length S of the linking traces 829 is less than 5,000 microns.

Following, the second built-up layer of the present invention will be described. FIGS. 9–17 are various cross-sectional views schematically showing a process of fabricating a chip structure according to an embodiment of the present invention.

Figure 9:
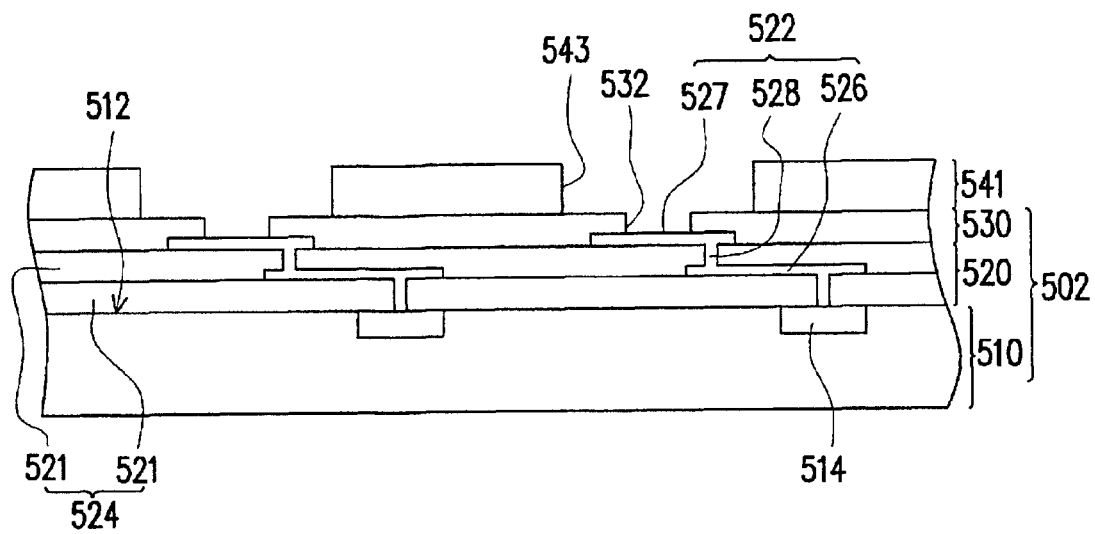
FIGS. 9–17 are various cross-sectional views schematically showing a process of fabricating a chip structure according to an embodiment of the present invention.

First, referring to FIG. 9, a wafer 502 is provided with a substrate 510, a first built-up layer 520 and a passivation layer 530. There are plenty of electric devices 514 on a surface 512 of the substrate 510. The first built-up layer 520 is formed on the substrate 510. The first built-up layer 520 includes a first interconnection scheme 522 and a first dielectric body 524, wherein the first interconnection scheme 522 interlaces inside the first dielectric body 524 and is electrically connected to the electric devices 514. The first dielectric body 524 is constructed from the lamination of first dielectric multi-layers 521. The first interconnection scheme 522 includes first metal multi-layers 526 and plugs 528. Through the plugs 528, the first metal layers 526 can be electrically connected with the electric devices 514 or the first metal layers 526 neighbored. The first interconnection scheme 522 further includes one or more conductive pads 527 (only shows one of them) that are exposed outside the first dielectric body 524. The passivation layer 530 is formed on the first built-up layer 520 and is provided with one or more openings 532 exposing the conductive pads 527. The largest width of the openings 532 ranges from 0.5 to 200 microns for example. Because the openings 532 can be formed relatively small, for example, the largest width of the openings 532 ranging from 0.5 to 20 microns, and, correspondingly, the conductive pads 527 can be formed relatively small, the routing density of the top metal layer having the conductive pads 527 can be enhanced. Moreover, due to the design of the openings 532 with relatively small dimensions and high density, correspondingly, the circuits, connecting with the conductive pads 527, of the second interconnection scheme can be formed small. As a result, the parasitic capacitance generated by the second interconnection scheme can become relatively small.

Next, a second dielectric sub-layer 541 is formed on the passivation layer 530 by, for example, a spin-coating process, wherein the second dielectric sub-layer 541 is made of, for instance, photosensitive organic material.

Subsequently, one or more via metal openings 543 are formed through the second dielectric sub-layer 541 using, for example, a photolithography process. The via metal openings 543 expose the conductive pads 527. In case that the width of the openings 532 is very small, the width of the via metal openings 543 can be designed to be larger than that of the openings 532. This leads conductive metals, during the following metal-filling process, to be easily filled into the via metal openings 543 and the openings 532. Also, the second dielectric sub-layer 541 can be made of non-photosensitive organic material such that the via metal openings 543 are formed using a photolithography and etching process. The sectional area of the via metal openings 543 ranges from 1 square micron to 10,000 square microns.

Figure 10:
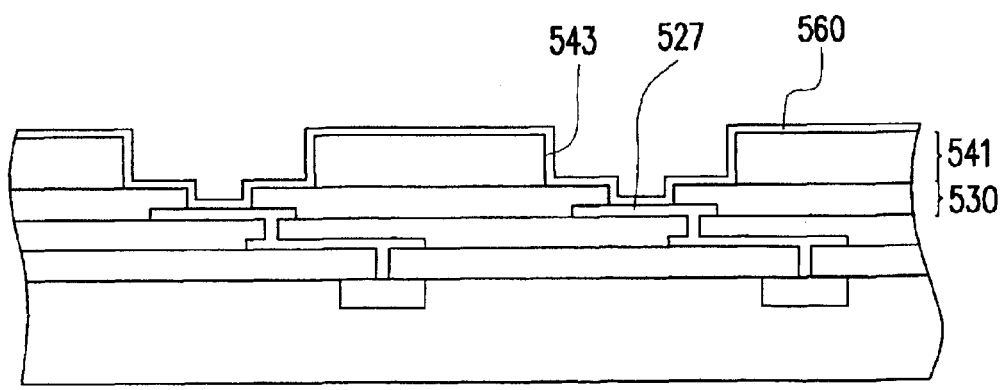
Figure 11:
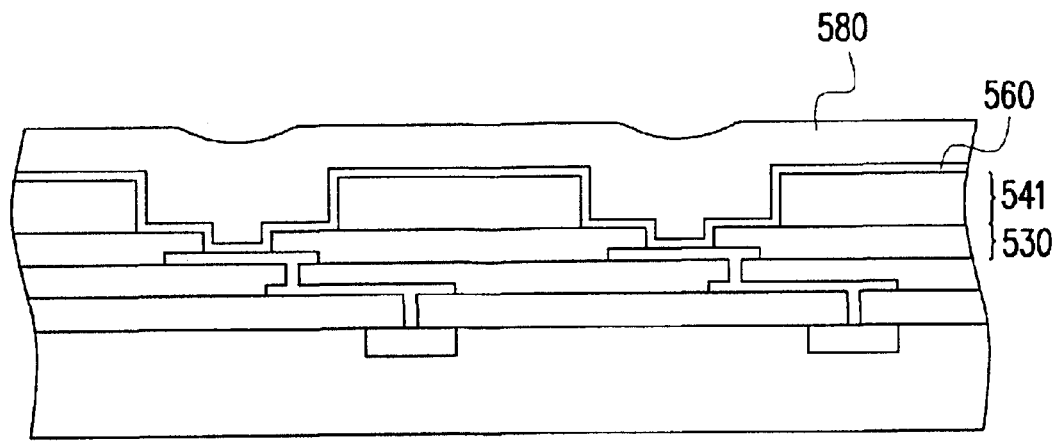
Figure 12:
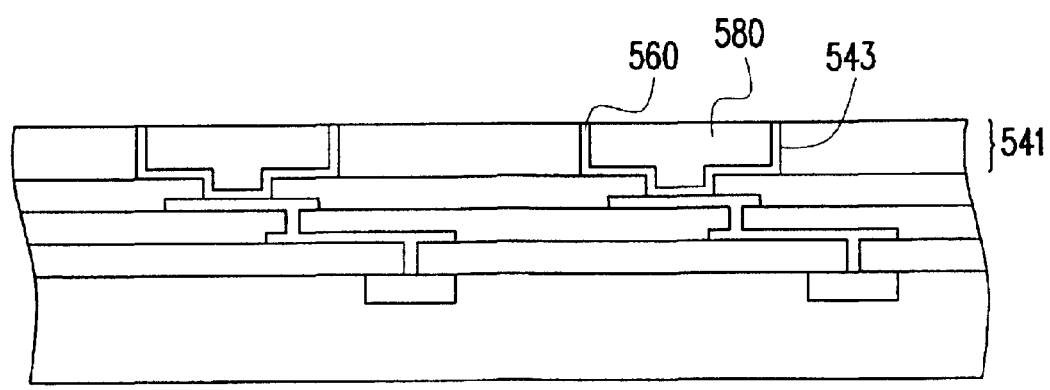

Next, referring to FIG. 10, by, for example, a sputtering process, a conductive layer 560 is formed onto the second dielectric sub-layer 541, onto the side walls of the via metal openings 543, and onto the passivation layer 530 and conductive pads 527 exposed by the via metal openings 543. The conductive layer 560 is made of, for example, aluminum, titanium-tungsten, titanium or chromium. Subsequently, one or more conductive metals 580 are deposited on the conductive layer 560 by, for example, an electroplating process or a sputtering process, as shown in FIG. 11. Then, a chemical-mechanical polishing process is preferably used to remove the conductive metals 580 and the conductive layer 560 that are located outside the via metal openings 543 until the second dielectric sub-layer 541 is exposed to the outside, as shown in FIG. 12.

Figure 13:
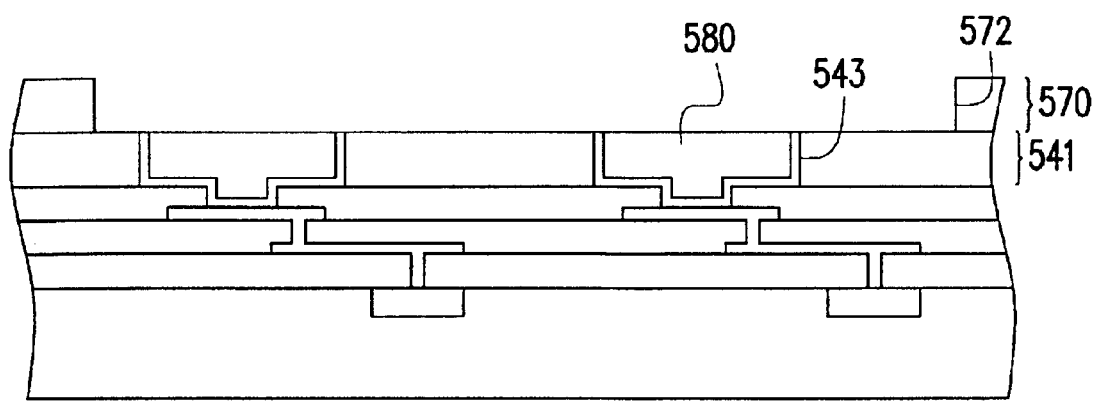
Figure 14:
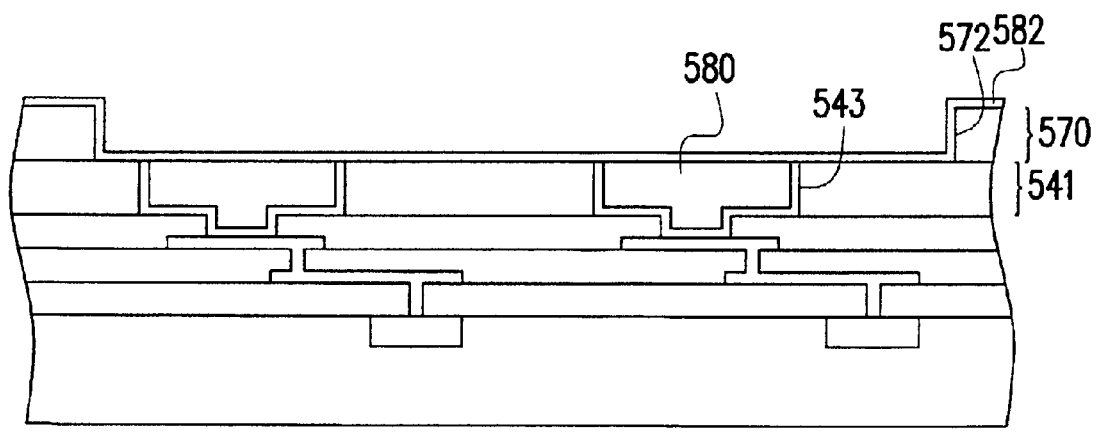
Figure 15:
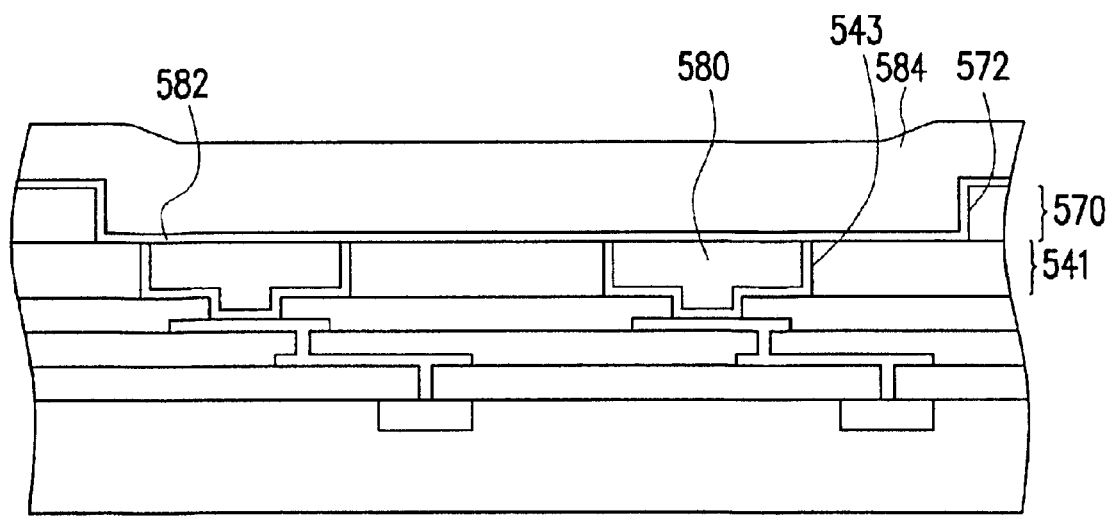
Figure 16:
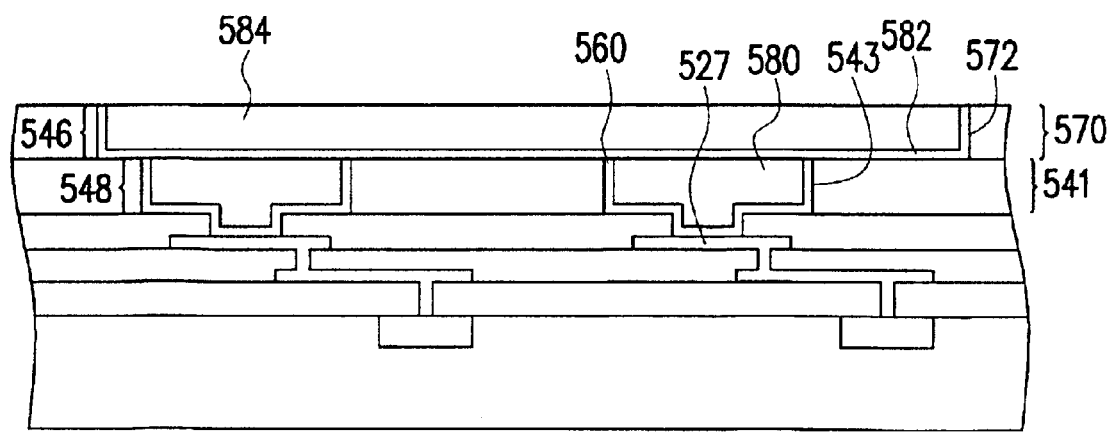

Subsequently, as shown in FIG. 13, by, for example, a spin-coating process, another second dielectric sub-layer 570 is formed onto the second dielectric sub-layer 541 previously formed. Then, a photolithography process or a photolithography and etching process is used to form one or more metal-layer openings 572 through the second dielectric sub-layer 570, wherein the metal-layer openings 572 expose the conductive metals 580 formed in the via metal openings 542 and the second dielectric sub-layer 541 to the outside. Next, referring to FIG. 14, by, for example, a sputtering process, another conductive layer 582 is formed onto the second dielectric sub-layer 570, 541, and onto the side walls of the metal-layer openings 572, and onto the conductive metals 580 formed in the via metal openings 543. Subsequently, one or more conductive metals 584 are deposited on the conductive layer 582 by, for example, an electroplating process or a sputtering process, as shown in FIG. 15. Then, a chemical-mechanical polishing process is preferably used to remove the conductive metals 584 and the conductive layer 582 that are located outside the metal-layer openings 572 until the second dielectric sub-layer 570 is exposed to the outside, as shown in FIG. 16. The conductive metals 584 and the conductive layer 582 that are settled in the metal-layer openings 572 are defined as a second metal layer 546. The conductive metals 584 and the conductive layer 582 that are settled in the via metal openings 543 are defined as via metal fillers 548. The second metal layer 546 can be electrically connected with conductive pads 527 through the via metal fillers 548. A wire-bonding process can be used at this time to form one or more wires electrically connecting the second metal layer 546 with external circuits.

Further, the other second dielectric sub-layer 590 can be selectively formed onto the conductive metals 584 and onto the second dielectric sub-layer 570. The second dielectric sub-layer 590 latest formed can be a photosensitive material. Then, a photolithography process is used to form one or more node openings 592 through the second dielectric sub-layer 590 wherein the node openings 592 expose the conductive metals 584 to the outside. The conductive metals 584 exposed to the outside are defined as nodes 547. The chip structure 500 can be electrically connected with external circuits through the nodes 547. Also, in case that the second dielectric sub-layer 590 can be a non-photosensitive material, a photolithography process and a etching process are used to form the node openings 592 through the second dielectric sub-layer 590. The second built-up layer 540 is completed so far. The second built-up layer 540 includes a second interconnection scheme 542 and a second dielectric body 544, wherein the second interconnection scheme 542 interlaces inside the second dielectric body 544. The second interconnection scheme 542 includes at least one second metal layer 546 and at least one via metal filler 548. The via metal filler 548 is constructed from the conductive metals 580 and the conductive layer 560 that are disposed in the via metal openings 543. The second metal layer 546 is constructed from the conductive metals 580 and the conductive layer 560 that are outside the via metal openings 543 and on the second dielectric sub-layer 541. The via metal filler 548 electrically connects the second metal layers 546 with the conductive pads 527. When the cross-sectional area of the openings 532 is very small, the cross-sectional area of the via metal openings 543 can be designed to be larger than that of the openings 532. The second dielectric body 544 is constructed from the lamination of the second dielectric sub-layers 541, 570, 590. The structure, material, and dimension of the second built-up layer 540 are detailed in the previous embodiments, and the repeat is omitted herein.

Figure 17:
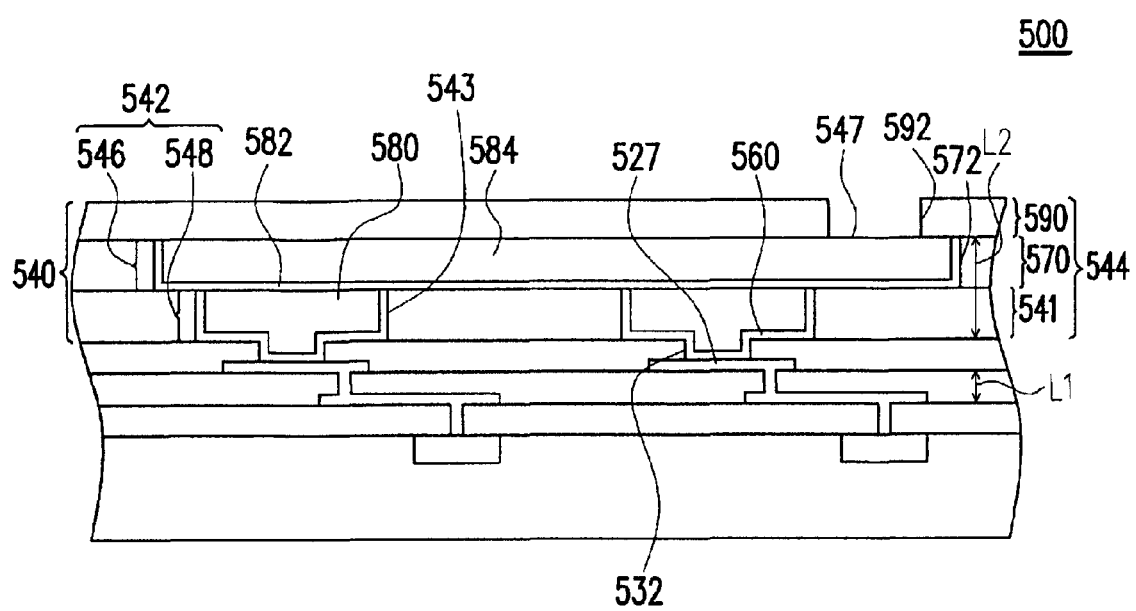
Figure 17A:
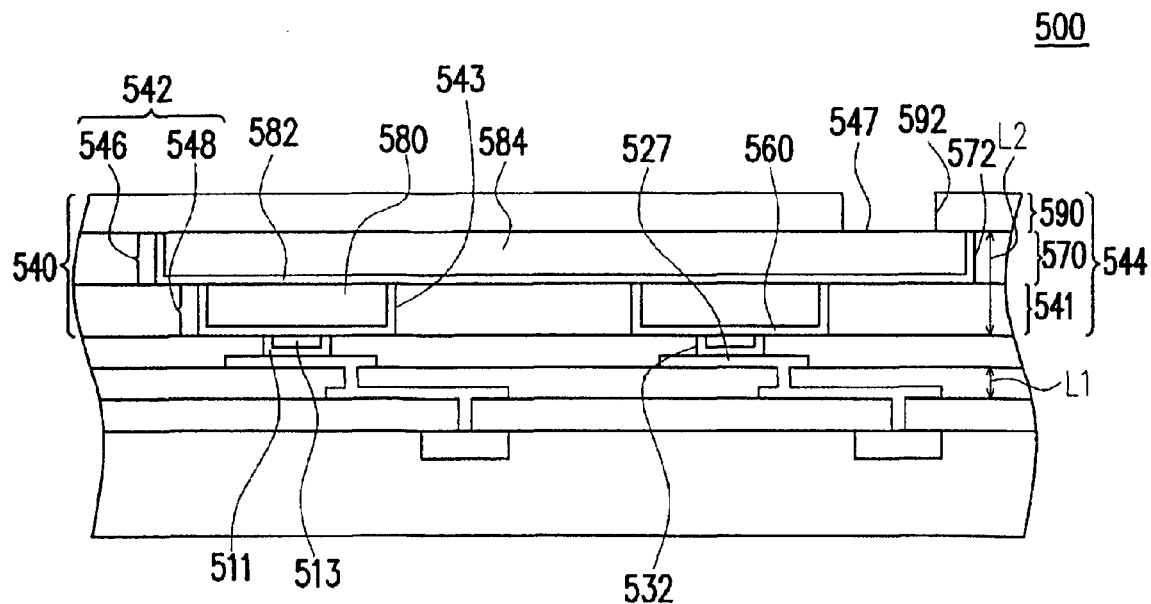
FIG. 17A is a cross-sectional view schematically showing a chip structure according to another embodiment of the present invention.

However, the present invention is not limited to the above fabricating process. Referring to FIG. 17A, FIG. 17A is a cross-sectional view schematically showing a chip structure according to another embodiment of the present invention. Before the formation of the second dielectric sub-layer 541, a conductive layer 511 and one or more conductive metals 513 are formed into the openings 532. In the process of forming the conductive layer 511 and the conductive metals 513 into the openings 532, first, the conductive layer 511 is formed onto the passivation layer 530, the conductive pads 527 and the side walls of the openings 532 using a sputtering process. Second, the conductive metals 513 are formed onto the conductive layer 511 using a sputtering process or an electroplating process. Third, a chemical-mechanical polishing process is preferably used to remove the conductive metals 513 and the conductive layer 511 that are located outside the openings 532 until the passivation layer 520 is exposed to the outside. So far, the conductive metals 513 and the conductive layer 511 are exactly formed into the openings 532. Subsequently, the second dielectric sub-layer 541 is formed on the passivation layer 530 by, for example, a spin-coating process and then one or more via metal openings 543 are formed through the second dielectric sub-layer 541 using, for example, a photolithography process. The via metal openings 543 expose the conductive metals 513 and the conductive layer 511 formed in the openings 532. Next, by, for example, a sputtering process, a conductive layer 560 is formed onto the second dielectric sub-layer 541, onto the side walls of the via metal openings 543, onto the passivation layer 530, the conductive metals 513 and the conductive layer 511 that are exposed by the via metal openings 543. The following process of fabricating the second built-up layer 540 is detailed in the previous embodiment, and the repeat is omitted herein.

Figure 17B:
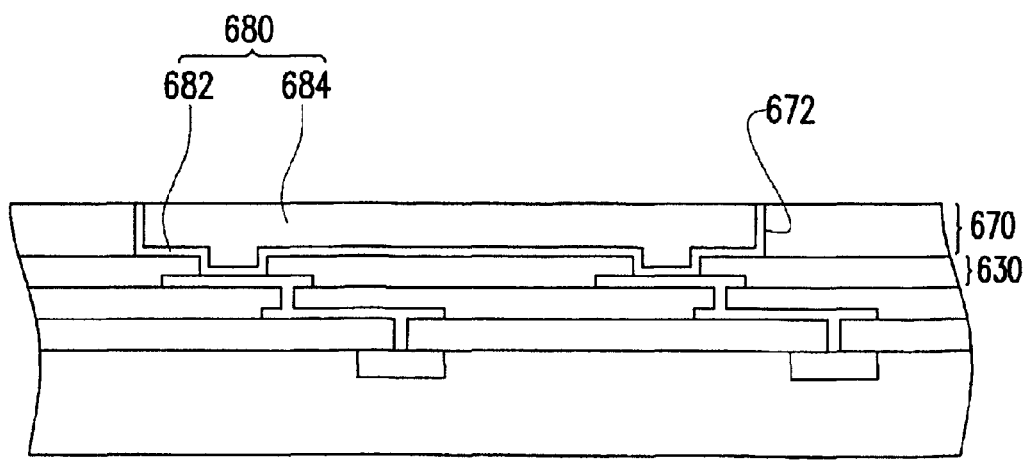
FIG. 17B is a cross-sectional view schematically showing a chip structure according to another embodiment of the present invention.
Figure 17C:
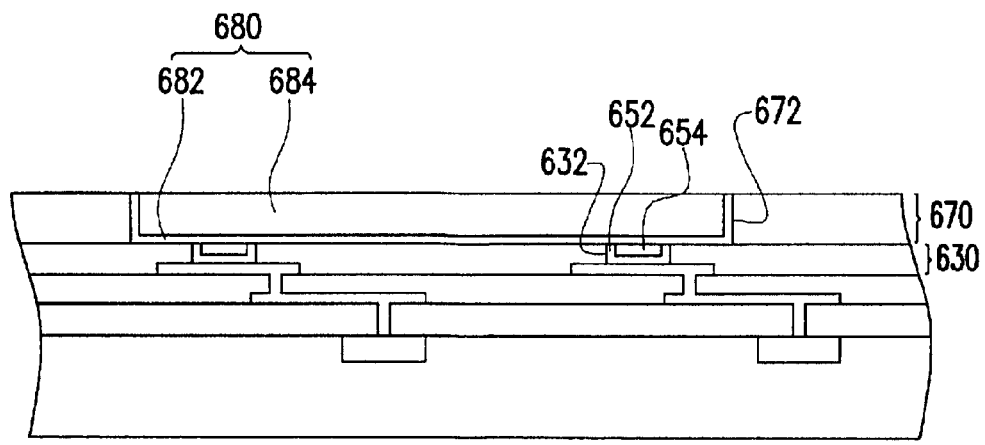
FIG. 17C is a cross-sectional view schematically showing a chip structure according to another embodiment of the present invention.

In addition, the chip structure is not limited to the above application. Referring to FIG. 17B, FIG. 17B is a cross-sectional view schematically showing a chip structure according to another embodiment of the present invention. A conductive layer 682 and conductive metals 684 that are directly formed on the passivation layer 630 can be interconnection traces 680. The interconnection traces 680 can be formed using a damascene process stated as the above embodiments. First, the second dielectric sub-layer 670 with metal-layer openings 672 in which interconnection traces 680 will be formed during the following processes is formed on the passivation layer 630. Next, a conductive layer 682 and conductive metals 684 are sequentially formed into the metal-layer openings 672 and onto the second dielectric sub-layer 670. Subsequently, the conductive layer 682 and conductive metals 684 outside the metal-layer openings 672 are removed. So far, the formation of the interconnection traces 680 constructed from the conductive layer 682 and the conductive metal 684 are completed. Optionally, as shown in FIG. 17C, before the second dielectric sub-layer 670 is formed on the passivation layer 630, a conductive layer 652 and conductive metals 654 are formed into the openings 632 of the passivation layer 630 using a damascene process as described in the above embodiment.

Besides, the chip structure of the present invention can also be performed by the other process, described as follows. FIGS. 18–23 are various cross-sectional views schematically showing a process of fabricating a chip structure according to another embodiment of the present invention.

Figure 18:
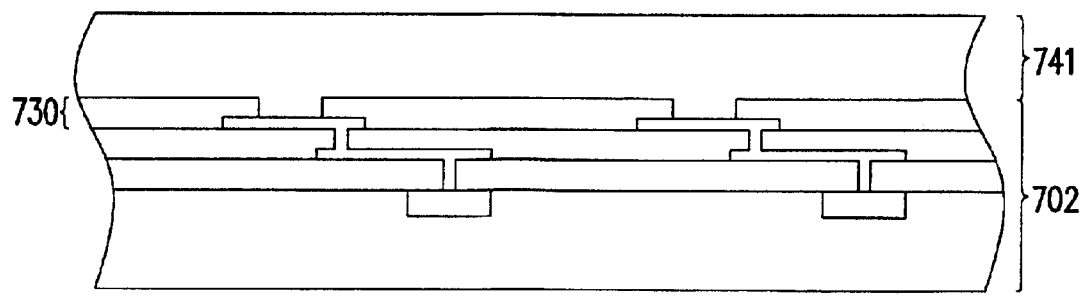
FIGS. 18–23 are various cross-sectional views schematically showing a process of fabricating a chip structure according to another embodiment of the present invention.

First, referring to FIG. 18, a wafer 702 is provided. The internal structure of the wafer 702 is detailed as the previous embodiments, and the repeat is omitted herein. Next, a second dielectric sub-layer 741 is formed onto the passivation layer 730 of the wafer 702 by, for example, a spin-coating process, wherein the second dielectric sub-layer 741 is made of, for instance, photosensitive material.

Figure 19:
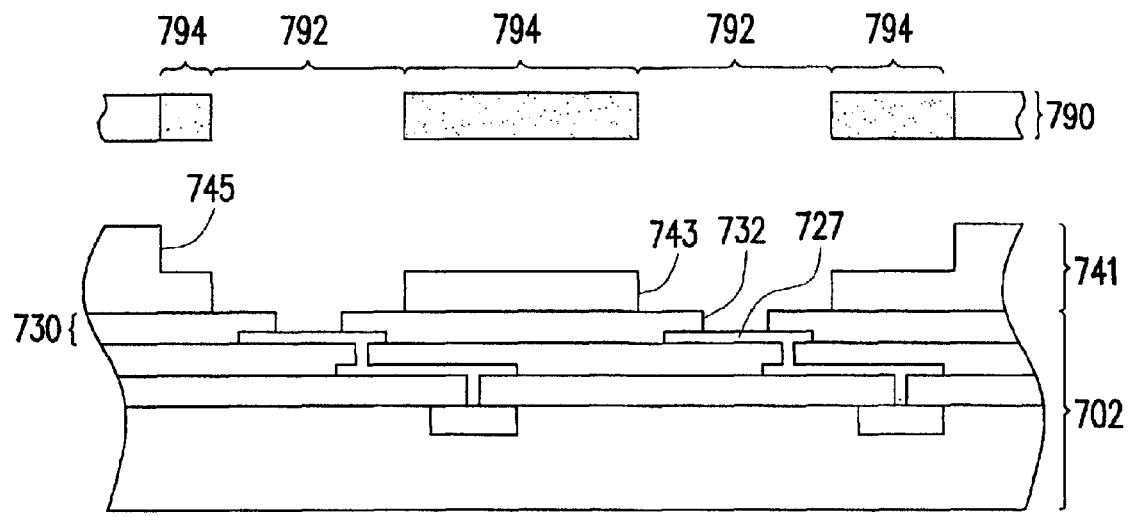

Subsequently, referring to FIG. 19, a lithography process is performed. During the lithography process, first, a photo mask 790 is provided. The photo mask 790 is divided into at least two regions, a first region 792 and a second region 794, wherein the energy of the light passing through the first region 792 is stronger than that of the light passing through the second region 794. Therefore, the first region 792 of the photo mask 790 can be designed as a through-hole type. Light, during an exposing process, can pass through the first region 792 without energy-loss. The second region 794 of the photo mask 790 can be designed as a type of a semi-transparent membrane. Light, during an exposing process, passes through the second region 794 with some energy-loss. Using the above photo mask 790 and controlling the exposure time, the second dielectric sub-layer 741 illuminated by light passing through the first region 792 can be exposed absolutely therethrough, while the second dielectric sub-layer 741 illuminated by light passing through the second region 794 can be partially exposed, i.e. not exposed absolutely therethrough. Therefore, after the lithography process is performed, one or more via metal openings 743 and one or more metal-layer openings 745 are formed in the second dielectric sub-layer 741. The via metal openings 743 and the metal-layer openings 745 expose conductive pads 727 to the outside. The via metal openings 743 are formed by light passing through the first region 792, while the metal-layer openings 745 are formed by light passing through the second region 794. In addition, when the cross-sectional area of the openings 732 of the passivation layer is very small, the cross-sectional area of the via metal openings 743 can be designed to be larger than that of the openings 732. This leads conductive metals, during the following metal-filling process, to be easily filled into the via metal openings 743. The cross-sectional area of the via metal fillers 743 preferably ranges from 1 square micron to 10,000 square microns.

Figure 20:
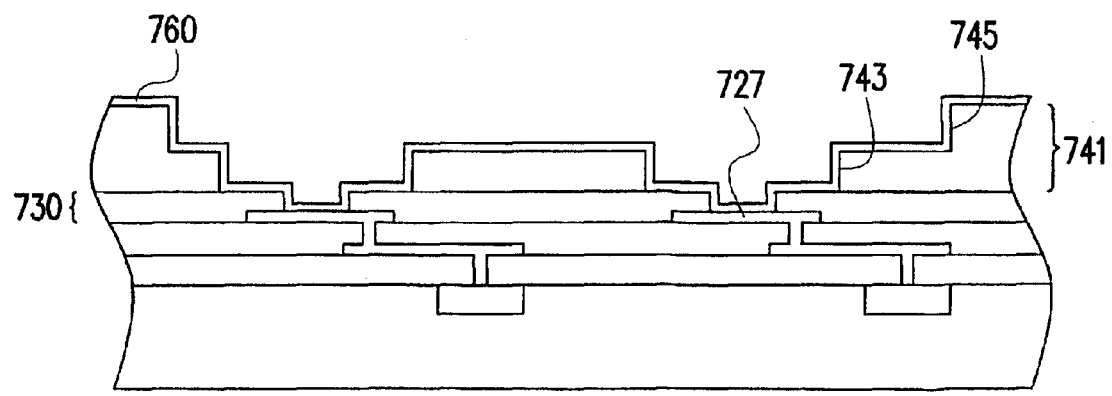

Referring to FIG. 20, by, for example, a sputtering process, a conductive layer 760 is formed onto the second dielectric sub-layer 741, onto the side walls of the via metal openings 743, onto the side walls of the metal-layer openings 745, and onto the passivation layer 730 and conductive pads 727 exposed by the via metal openings 743. The conductive layer 760 is made of, for example, aluminum, titanium-tungsten, titanium or chromium.

Figure 21:
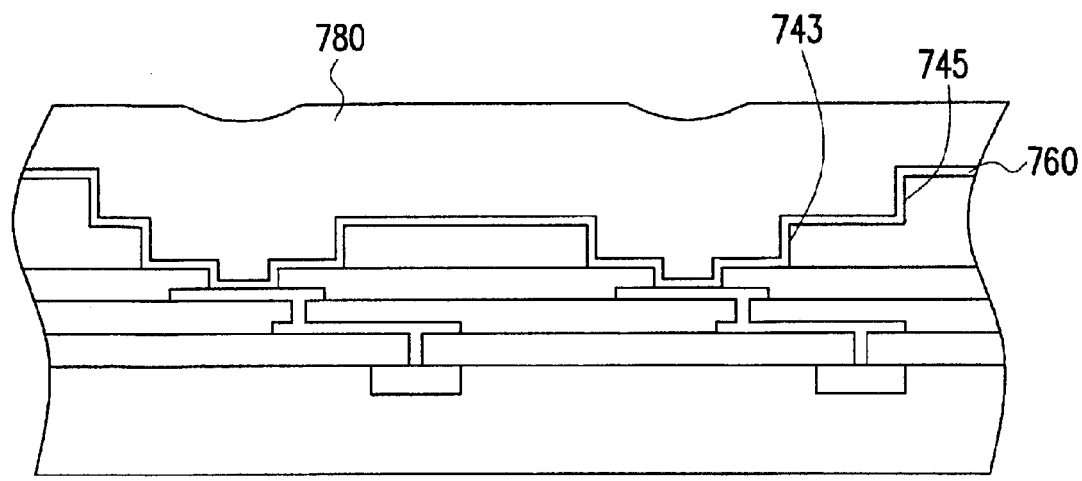
Figure 22:
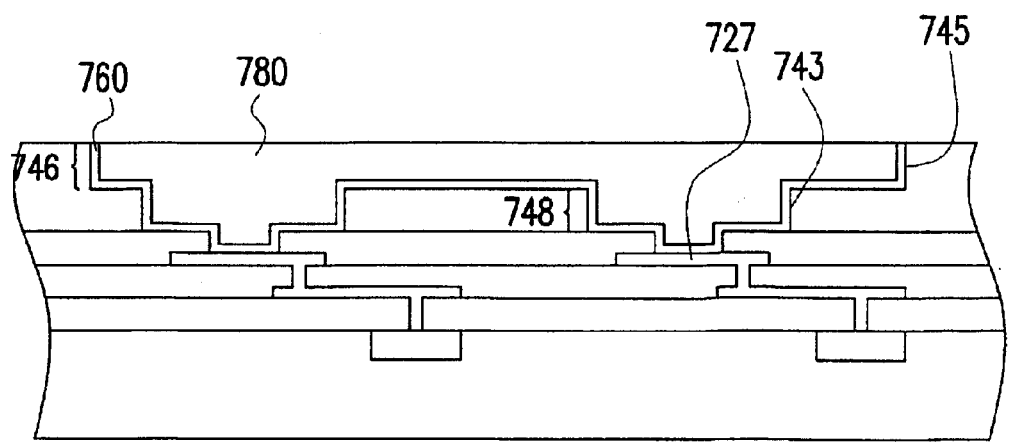
Figure 23:
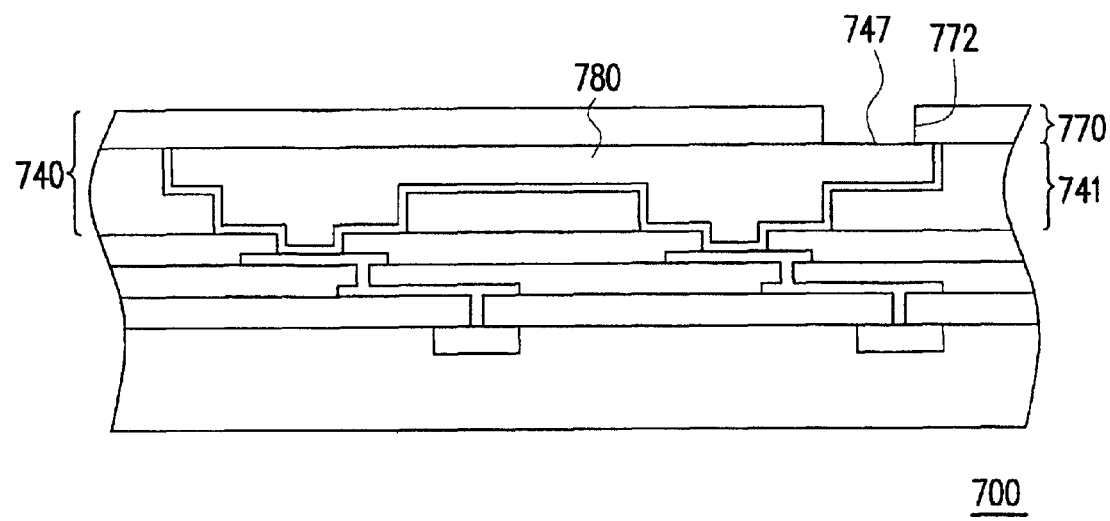

Next, one or more conductive metals 780 are deposited on the conductive layer 582 by, for example, an electroplating process or a sputtering process, as shown in FIG. 21. The material of the conductive metals 780 includes copper, nickel, gold or aluminum. Then, a chemical-mechanical polishing process is preferably used to remove the conductive metals 780 and the conductive layer 760 that are deposited outside the metal-layer openings 745 and the via metal openings 743 until the second dielectric sub-layer 741 is exposed to the outside, as shown in FIG. 22. The conductive metals 780 and the conductive layer 760 that are settled in the metal-layer openings 745 are defined as a second metal layer 746. The conductive metals 780 and the conductive layer 760 that are settled in the via metal openings 743 are defined as via metal fillers 748. The second metal layer 746 can be electrically connected with conductive pads 727 through the via metal fillers 748. A wire-bonding process can be used at this time to form one or more wires electrically connecting the second metal layer 746 with external circuits.

Further, the other second dielectric sub-layer 770 can be selectively formed onto the conductive metals 780 and onto the second dielectric sub-layer 741. The second dielectric sub-layer 770 latest formed can be a photosensitive material. Then, a photolithography process is used to form one or more node openings 772 through the second dielectric sub-layer 770 wherein the node openings 772 expose the conductive metals 780 to the outside. The conductive metals 780 exposed to the outside are defined as nodes 747. The chip structure 700 can be electrically connected with external circuits through the nodes 747. The structure, material, and dimension of the second built-up layer 740 are detailed in the previous embodiments, and the repeat is omitted herein.

In the above-mentioned process, via metal openings and metal-layer openings are formed by only one photolithography process. However, the application of the present invention is not limited to the previous embodiments. The second dielectric sub-layer can be formed using other processes, described as follows.

Figure 24:
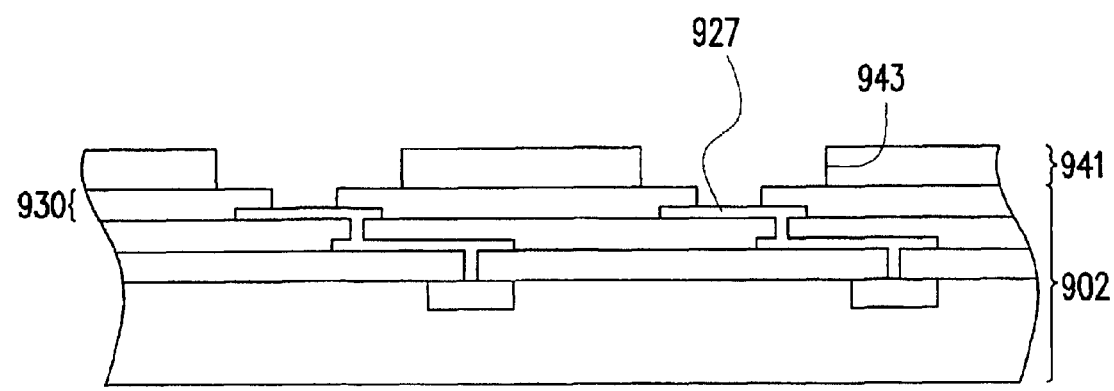
FIGS. 24–26 are various cross-sectional views schematically showing a process of fabricating a dielectric sub-layer according to another embodiment of the present invention.
Figure 25:
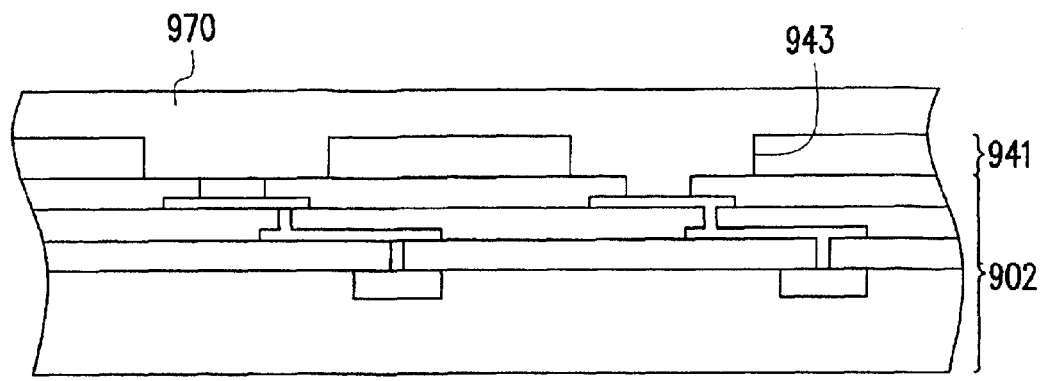
Figure 26:
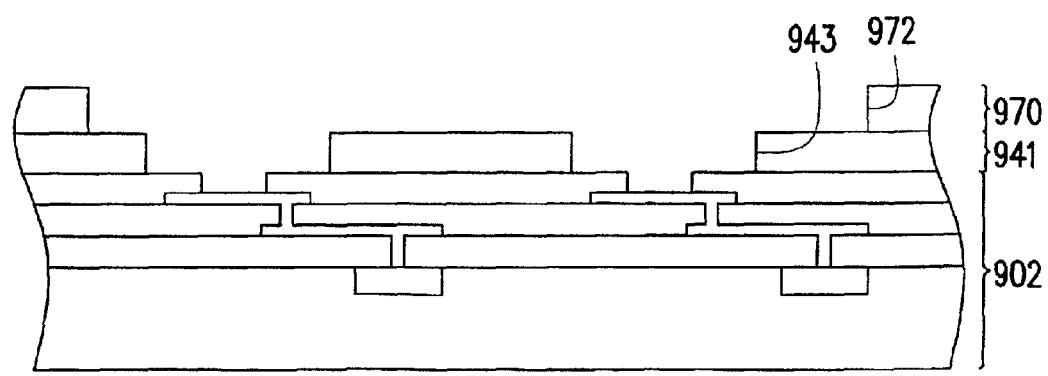

Referring to FIGS. 24–26, FIGS. 24–26 are various cross-sectional views schematically showing a process of fabricating a dielectric sub-layer according to another embodiment of the present invention. First, referring to FIG. 24, a second dielectric sub-layer 941 is formed onto the passivation layer 930 of the wafer 902 and onto conductive pads 927 using, for example, a spin-coating process, wherein the second dielectric sub-layer 941 is non-photosensitive material. Subsequently, via metal openings 943 are formed through the second dielectric sub-layer 941 using, for example, a photolithography process and an etching process, wherein the via metal openings 943 expose conductive pads 927. Next, referring to FIG. 25, another second dielectric sub-layer 970 is formed onto the second dielectric sub-layer 941 using, for example, a spin-coating process. Further, the second dielectric sub-layer 970 is filled into the via metal openings 943. The second dielectric sub-layer 970 is photosensitive material. Subsequently, using an exposing process and a developing process, metal-layer openings 972 are formed through the second dielectric sub-layer 970 and the second dielectric sub-layer 970 deposited in the via metal openings 943 is removed, as shown in FIG. 26. After the via metal openings 943 and the metal-layer opening 972 are formed, the following process, including a process of forming a conductive layer, a process of forming conductive metals, and a process of removing the conductive layer and the conductive metals deposited outside the metal-layer openings, is similar with the previous embodiment. The repeat is omitted herein.

In addition, the etching selectivity between the second dielectric sub-layer 941 and the second dielectric sub-layer 970 is requested to be high. In other words, the etchant of the second dielectric sub-layer 970 hardly etches the first dielectric sub-layer 941. Therefore, after the second dielectric sub-layer 970 is formed onto the second dielectric sub-layer 941 and filled into the via metal openings 943, a photolithography process and an etching process can be used to form metal-layer openings 972 and to remove the second dielectric sub-layer 970 deposited in the via metal openings 943.

In addition, according to the above process, the present invention is not limited to the application of the second metal layer with a signal layer. However, second metal multi-layers also can be applied in the present invention. The fabrication method of the second metal multi-layers is to repeat the above fabrication method of the second metal layer with a single layer. The second built-up layer, with second metal multi-layers, fabricated by the above whatever process is finally formed with a second dielectric sub-layer having node openings that expose the second interconnection scheme to be electrically connected with external circuits. Alternatively, the whole surface of the second metal layer at the top portion can be exposed to the outside, and through bumps or conducting wires, the second metal layer can be electrically connected with external circuits. Besides, when the second metal layers is over 2 layers, the via metal openings of the second dielectric sub-layer at a higher portion expose the second metal layer at a lower portion so that the conductive metals disposited in the via metal openings electrically connect the upper second metal layer with the lower second metal layer.

According to the above process, the conductive layer or the conductive metal can be simultaneously formed into the openings formed through the passivation layer, via metal openings and metal-layer openings, and the configuration constructed from the conductive layer and the conductive metal is shaped with triple layers. Therefore, the process can be called as "triple damascene process".

To sum up, the present invention has the following advantages:

1. The chip structure of the present invention can decline the resistance-capacitance delay, the power of the chip, and the temperature generated by the driving chip since the cross sectional area, the width and the thickness of the traces of the second metal layer are extremely large, since the cross sectional area of the via metal filler is also extremely large, since the second interconnection scheme can be made of low-resistance material, such as copper or gold, since the thickness of the individual second dielectric layer is also extremely large, and since the second dielectric body can be made of organic material, the dielectric constant of which is very low, approximately between 1~3, the practical value depending on the applied organic material.

2. According to the chip structure of the present invention, each of the power buses or the ground buses can electrically connect with more electric devices than that of prior art.

Consequently, the number of the power buses or the ground buses can be reduced and, also, the number of the electrostatic discharge circuits accompanying the power buses or the ground buses can be reduced. In addition, the number of the nodes accompanying the power buses or the ground buses can be reduced. Thus, the circuit layout can be simplified and the production cost of the chip structure can be saved. The electrostatic discharge circuits can prevent the electric devices electrically connected with the second interconnection scheme from being damaged by the sudden discharge of high voltage.

3. The chip structure of the present invention can simplify a design of a substrate board due to the node layout redistribution, fitting the design of the substrate board, of the chip structure by the second interconnection scheme and, besides, the application of the fewer nodes to which ground voltage or power voltage is applied. Moreover, in case the node layout redistribution of various chips by the second interconnection scheme causes the above various chips to be provided with the same node layout, the node layout, matching the same node layout of the above various chips, of the substrate board can be standardized. Therefore, the cost of fabricating the substrate board substantially drops off.

4. According to the chip structure of the present invention, the second interconnection scheme can be produced using facilities with low accuracy. Therefore, production costs of the chip structure can substantially be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. The process for fabricating a chip structure, comprising:
    Step 1: providing a wafer having a plurality of electric devices, an interconnection scheme and a passivation layer, the interconnection scheme electrically connected to the electric devices, the passivation layer covering the electric devices and the interconnection scheme;
    Step 2: forming a dielectric sub-layer over the passivation layer of the wafer, the dielectric sub-layer having at least one opening passing through the dielectric sub-layer;
    Step 3: forming at least one conductive metal over the dielectric sub-layer and into the opening; and
    Step 4: removing the conductive metal formed outside the opening.

2. The process according to claim 1, wherein before Step 3 is performed, a conductive layer is formed on the dielectric sub-layer, and when Step 3 is performed, the conductive metal is formed on the conductive layer.

3. The process according to claim 1, wherein after Step 4, another dielectric sub-layer is formed over the passivation layer, and the another dielectric sub-layer covers the conductive metal.

4. The process according to claim 3, wherein after the another dielectric sub-layer is formed over the passivation layer, at least one node opening is formed through the another dielectric sub-layer and exposes the conductive metal.

5. The process according to claim 1, wherein the sequential steps 2–4 are repeated at least one time.

6. The process according to claim 5, wherein after Step 2 is performed each time, the opening of the dielectric sub-layer exposes the conductive metal formed over the passivation layer.

7. The process according to claim 5, wherein after the sequential steps 2–4 are repeated at least one time, another dielectric sub-layer is formed over the passivation layer, and the another dielectric sub-layer covers the top conductive metal.

8. The process according to claim 7, wherein after the another dielectric sub-layer is formed over the passivation layer, at least one node opening is formed through the another dielectric sub-layer and exposes the conductive metal.

9. The process according to claim 1, wherein the passivation layer having at least one opening exposing the interconnection scheme, further, during Step 2, the opening of the dielectric sub-layer exposes the opening of the passivation layer and the interconnection scheme exposed by the opening of the passivation layer.

10. The process according to claim 1, wherein during Step 3, a sputtering process, an electroplating process or both is used to form the conductive metal over the dielectric sub-layer and into the opening.

11. The process according to claim 1, wherein the material of the conductive metal includes titanium-tungsten alloy, titanium, chromium, aluminum, copper, nickel, or gold.

12. The process according to claim 1, wherein during Step 4, a chemical-mechanical polishing process is used to remove the conductive metal formed outside the opening.

13. The process for fabricating a chip structure, comprising:
    Step 1: providing a wafer having a plurality of electric devices, an interconnection scheme and a passivation layer, the interconnection scheme electrically connected to the electric devices, the passivation layer covering the electric devices and the interconnection scheme;
    Step 2: forming a first dielectric sub-layer over the passivation layer of the wafer, the first dielectric sub-layer having at least one via metal opening passing through the first dielectric sub-layer;
    Step 3: forming a first conductive layer onto the first dielectric sub-layer and into the via metal opening;
    Step 4: forming at least one first conductive metal over the first conductive layer;
    Step 5: removing the first conductive layer and the first conductive metal that are formed outside the via metal opening;
    Step 6: forming a second dielectric sub-layer onto the first dielectric sub-layer, the second dielectric sub-layer having at least one metal-layer opening passing through the second dielectric sub-layer, the metal-layer opening exposing the first conductive metal formed in the via metal opening;
    Step 7: forming a second conductive layer onto the second dielectric sub-layer and into the metal-layer opening;
    Step 8: forming at least one second conductive metal over the second conductive layer; and
    Step 9: removing the second conductive layer and the second conductive metal that are formed outside the metal-layer opening.

14. The process according to claim 13, wherein after Step 9, a third dielectric sub-layer is formed over the passivation layer, and the third dielectric sub-layer covers the second conductive metal.

15. The process according to claim 14, wherein after the third dielectric sub-layer is formed over the passivation layer, at least one node opening is formed through the third dielectric sub-layer and exposes the second conductive metal.

16. The process according to claim 13, wherein the sequential steps 2–9 are repeated at least one time.

17. The process according to claim 16, wherein after Step 2 is performed each time, the via metal opening exposes the second conductive metal formed over the passivation layer.

18. The process according to claim 16, wherein after the sequential steps 2–9 are repeated at least one time, a third dielectric sub-layer is formed over the passivation layer, and the third dielectric sub-layer covers the top second conductive metal.

19. The process according to claim 18, wherein after the third dielectric sub-layer is formed over the passivation layer, at least one node opening is formed through the third dielectric sub-layer and exposes the top second conductive metal.

20. The process according to claim 13, wherein the passivation layer having at least one opening exposing the interconnection scheme, further, during Step 2, the via metal opening exposing the opening of the passivation layer and the interconnection scheme exposed by the opening of the passivation layer.

21. The process according to claim 13, wherein during Step 3, a sputtering process is used to form the first conductive layer onto the first dielectric sub-layer and into the via metal opening.

22. The process according to claim 13, wherein during Step 4, a sputtering process or an electroplating process is used to form the first conductive metal over the first conductive layer.

23. The process according to claim 13, wherein during Step 5, a chemical-mechanical polishing process is used to remove the first conductive metal and the first conductive layer that are formed outside the via metal opening.

24. The process according to claim 13, wherein during Step 7, a sputtering process is used to form the second conductive layer onto the second dielectric sub-layer and into the metal-layer opening.

25. The process according to claim 13, wherein during Step 8, a sputtering process or an electroplating process is used to form the second conductive metal over the second conductive layer.

26. The process according to claim 13, wherein during Step 9, a chemical-mechanical polishing process is used to remove the second conductive metal and the second conductive layer that are formed outside the metal-layer opening.

27. The process according to claim 13, wherein the material of the first conductive layer includes titanium-tungsten alloy, titanium, chromium or aluminum.

28. The process according to claim 13, wherein the material of the first conductive metal includes aluminum, copper, nickel, or gold.

29. The process according to claim 13, wherein the material of the second conductive layer includes titanium-tungsten alloy, titanium or chromium or aluminum.

30. The process according to claim 13, wherein the material of the second conductive metal includes aluminum, copper, nickel, or gold.

31. A process for fabricating a chip structure, comprising:

Step 1: providing a wafer having a plurality of electric devices, an interconnection scheme and a passivation layer, the interconnection scheme electrically connected to the electric devices, the passivation layer covering the electric devices and the interconnection scheme, the passivation layer having at least one opening exposing the interconnection scheme;

Step 2: forming a dielectric sub-layer onto the passivation layer, the dielectric layer having at least one metal-layer opening passing through the dielectric sub-layer, the metal-layer opening exposing the opening of the passivation layer;

Step 3: forming at least one conductive metal into the opening of the passivation layer, into the metal-layer opening and onto the dielectric sub-layer; and Step 4: removing the conductive metal that is formed outside the metal-layer opening and the opening of the passivation layer.

32. The process according to claim 31, wherein during Step 3, a sputtering process or an electroplating process is used to form the conductive metal into the opening of the passivation layer, into the metal-layer opening and onto the dielectric sub-layer.

33. The process according to claim 31, wherein during Step 4, a chemical-mechanical polishing process is used to remove the conductive metal that is formed outside the metal-layer opening.

34. The process according to claim 31, wherein the material of the first conductive layer includes titanium-tungsten alloy, titanium, chromium, aluminum, copper, nickel or gold.

* * * * *